United States Patent [19]

DeLeonardis et al.

[11] 4,007,713
[45] Feb. 15, 1977

[54] TEST CIRCUIT

[75] Inventors: Michael J. DeLeonardis; Donado DeLeonardis, both of Valley Stream, N.Y.

[73] Assignee: Hydrolevel Corporation, Farmingdale, N.Y.

[22] Filed: Aug. 28, 1975

[21] Appl. No.: 608,552

[52] U.S. Cl. .............................. 122/504; 340/214; 122/504.2
[51] Int. Cl.² ........................................ F22B 37/42
[58] Field of Search .................. 122/504, 504.2; 340/214, 410

[56] References Cited
UNITED STATES PATENTS

| | | |
|---|---|---|
| 2,798,214 | 7/1957 | Rowell .............................. 340/410 |
| 3,366,095 | 1/1968 | Leonardis .......................... 122/504 |
| 3,803,569 | 4/1974 | Iwasaki .............................. 340/214 |
| 3,834,357 | 9/1974 | Kaczmarek et al. ................ 122/504 |

Primary Examiner—Kenneth W. Sprague
Attorney, Agent, or Firm—Buckles and Bramblett

[57] ABSTRACT

A test circuit for use with a boiler control circuit. A test switch and a lamp are connected between ground and a water level electrode. In the presence of a water path, a sufficient potential drop exists between ground and the electrode to light the lamp when the test switch is closed. If a ground or short exists, the lamp will not light.

5 Claims, 3 Drawing Figures

TEST CIRCUIT

BACKGROUND OF THE INVENTION

In U.S. Pat. No. 3,366,095 which issued Jan. 30, 1968 for "Control System and Warp Switch," there is disclosed a boiler control circuit. One element of that circuit comprises an electrode normally immersed in the boiler water. As long as an electrical water path exists between the electrode and ground, the circuit functions normally. In the absence of such a path, the circuit prevents the burner from igniting.

While the patented circuit represents an important advance over the prior art, the water level electrode portion can be defeated if a short develops between the electrode and ground. The circuit is then unable to distinguish between such a short and a water path. Accordingly, it is a primary object of the present invention to provide a test sub-circuit for differentiating between a water path and a short circuit. Other objects, features, and advantages will become apparent from the following description and appended claims.

SUMMARY OF THE INVENTION

An improvement in a control circuit of the type having a water path through which electrical current normally flows. The improvement comprises a normally open test switch and a voltage indicator connected in series with the switch across the water path.

DESCRIPTION OF THE PREFERRED EMBODIMENTS

The invention is described herein as applied to a boiler control circuit for shutting off the burner and giving warning if the water in the boiler falls below an electrode positioned in the boiler.

Figure 1:
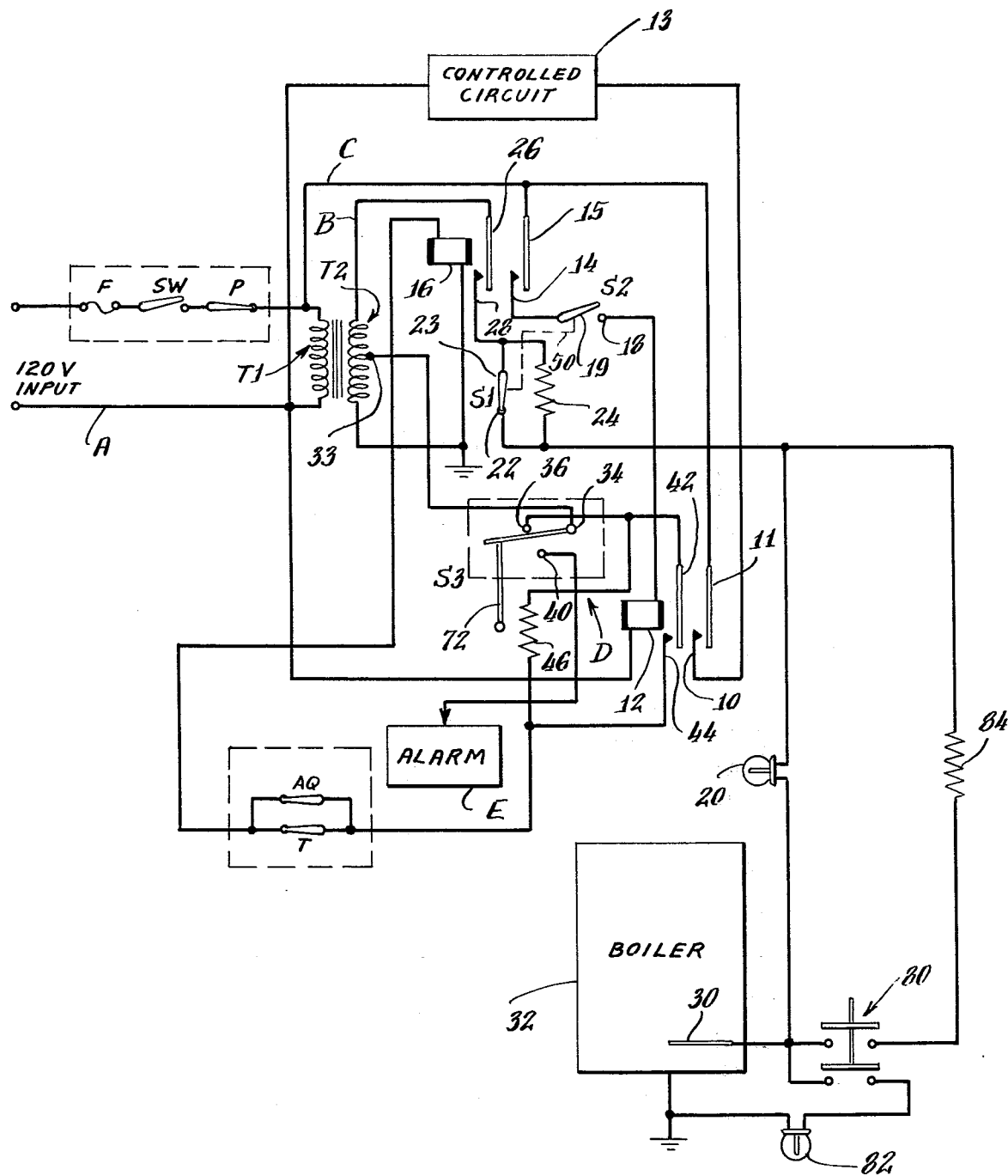
FIG. 1 is a schematic diagram of a circuit incorporating the improvement of this invention.

As shown in the circuit of FIG. 1, an input circuit A, having a source of power, which may be a house power supply comprising 120 volts, leads to the primary T-1 of an input transformer. Within this circuit a conventional fuse F, on-off switch SW, and "pressure-trol" P are provided.

The input circuit A is connected directly to a second or operating circuit C, comprising a pair of contacts 10 and 11 controlled by relay coil 12. When circuit C is closed, it actuates a controlled circuit 13 which, for the purpose of this description, may be considered to be a circuit controlling a burner (not shown) associated with a boiler 32. Included in circuit C is a pair of contacts 14 and 15 controlled by relay coil 16, and a switch S-2, which may be a miniature or micro switch, having a contact 18 and a movable contact arm 19. Contact 18 of switch S-2 is connected to relay coil 12.

The secondary T-2 of the transformer is connected at one end to a first, or lamp heating circuit B, and a part of secondary T-2 is connected in a third or reset circuit D.

The first or heating circuit B comprises a lamp 20 in series with a parallel combination of a normally closed switch S-1, which may be a miniature or micro switch, and a resistance 24. Switch S-1 comprises a contact 22 and movable arm contact 23. Circuit B also includes a contact 28 and a movable contact arm 26 controlled by relay coil 16, and electrode 30 disposed within the boiler 32. Relay 16 is energized when either the thermostat T or the aquastat AQ calls for heat and causes contacts 26 and 28 to close. At the same time, contacts 14 and 15 in circuit C are closed.

It will be understood that the controlled burner circuit 13 will be needed only if either the thermostat T or the aquastat AQ is calling for heat and the water level in the boiler is above electrode 30. When either T or AQ is closed, relay coil 16 is energized, contacts 26 and 28 close, and lamp 20 is lighted and starts radiating heat to a heat responsive arm 50 (shown as a mechanical interconnection between switches S-1 and S-2). The details of arm 50 are fully described in above mentioned U.S. Pat. No. 3,366,095. Arm 50 heats and starts to bend or is otherwise distorted and first closes switch S-2 and then opens switch S-1, shunting the current through resistance 24 thus reducing the voltage across lamp 20 from 120 v. to 60 v. This permits bimetal arm 50 to cool and unbend until switch S-1 is closed again. Thus the range of bending of arm 50 is limited and, if the water level falls too low, it will not require more than one and one half minutes for arm 50 to unbend enough to open switch S-2 and deenergize the controlled burner circuit 13. Opening switch S-2 also deenergizes relay coil 12 causing contacts 44, 42 to separate (and also contacts 10, 11) and this shunts the current through heating coil 46 which distorts heat responsive means 72, opening the reset circuit D and closing the alarm circuit E. The control system cannot again become operative until the reset is closed manually. This should be enough to prevent an operator from permitting water to be supplied into the boiler while it is overheated.

The third circuit D has a tap 33 leading from an intermediate point T-2, to provide 24 volts, for example, to a movable contact arm 34 which is common to both the reset and alarm circuits and is movable between contact 36 of the reset circuit and contact 40 of the alarm circuit. Contact 36 is connected both to contact 42 of the pair of contacts 42, 44 controlled by relay 12, and to the heating coil 46 which is in parallel with the pair of contacts 42, 44. When the circuit is operating safely, contact arm 34 will be held against contact 36 by heat distortable means, and, as illustrated herein, specifically by the free end of bimetal strip 72. If relay 12 is deenergized, as it is when circuit B is opened, and contacts 42, 44 are separated, current is shunted through heating coil 46, and the heat from coil 46 actuates the heat distortable means which causes the free end of strip 72 to bend and move beyond the free end of arm 34 which then drops onto contact 40 of the alarm circuit. The free end of strip 72 is inclined so that it overlies the free end of arm 34 after arm 34 has dropped, and thus arm 34 is locked in contact with contact 40 of the alarm circuit until it is manually freed by pushing a reset button.

The combination of contacts 36 and 40 and the movable contact 34 are identified in the drawings as S-3.

With the reset switch closed, as it normally is, and with the lamp or other heat source 20 radiating heat at either of two levels, bimetal arm 50 operates, after a predetermined interval, to close switch S-2, energizing relay coil 12 and closing contacts 10, 11 of the second or operating circuit C, which in turn actuates the controlled circuit 13. Relay coil 12 closes contacts 42, 44 of the reset circuit D at the same time.

If the water level in boiler 32 falls below the electrode 30, after a short interval, switch S-2 is opened, due to unbending of the strip 50, relay coil 12 is deenergized, and the contacts 42, 44 (and also contacts 10, 11) are opened, coil 46 is heated and after a predetermined interval actuates the heat responsive means described above and causes movable contact arm 34 to move from contact 36 to contact 40 thus opening the reset circuit and closing the alarm circuit switch.

It will, of course, be understood that the lamp 20 is actually adjacent the strip 50 to transfer heat thereto. The mechanical structure is fully disclosed in the above mentioned patent.

The time intervals, between energizing the heat source, closing contacts 18, 19, opening contacts 22, 23 and reclosing contacts 22, 23 and for actuating the reset switch to open after contacts 42, 44 have opened, can be arranged as desired. Good results have been obtained with a system in which an interval of one-half minute is required after the heat source is energized, for the arm 50 to bend sufficiently to close the operating circuit C by closing contacts 18, 19. The contacts 22, 23 of switch S-1 are not opened for 15 seconds after contacts 18, 19 close, and contacts 22, 23 of S-1 may remain open indefinitely as long as the lamp is being heated through the resistance 24. Usually, however, arm 50 unbends enough with reduced heating from lamp 20 to again close contacts 22, 23 in from 2 to 5 minutes. Two minutes are required for opening of the reset switch after contacts 42, 44 are separated and heating coil 46 is energized.

It is, of course, important that electrode 30 not become shorted or grounded against boiler 32 as this would give a false indication of water in the boiler. Accordingly, by means of the present invention, there is added a test circuit comprising a normally open, spring-loaded, double pole, push button switch 80 and a 2.7 VAC lamp 82. The lamp 82 is connectable between electrode 30 and ground through one pole of switch 80. A 3,500 ohm, 3 watt resistor 84 is connectable across lamp 20 through the other pole of switch 80. Under normal operation, there is a potential drop across the water path between electrode 30 and ground. Actuation of test switch 80 places lamp 82 across this path. Simultaneously, resistance 84 is placed in parallel with lamp 20 to reduce the overall resistance of the circuit and provide sufficient current to light lamp 82. The existence of direct connection between electrode 30 and ground will effectively short the lamp 82 and its failure to light will signal the presence of a fault.

Figure 2:
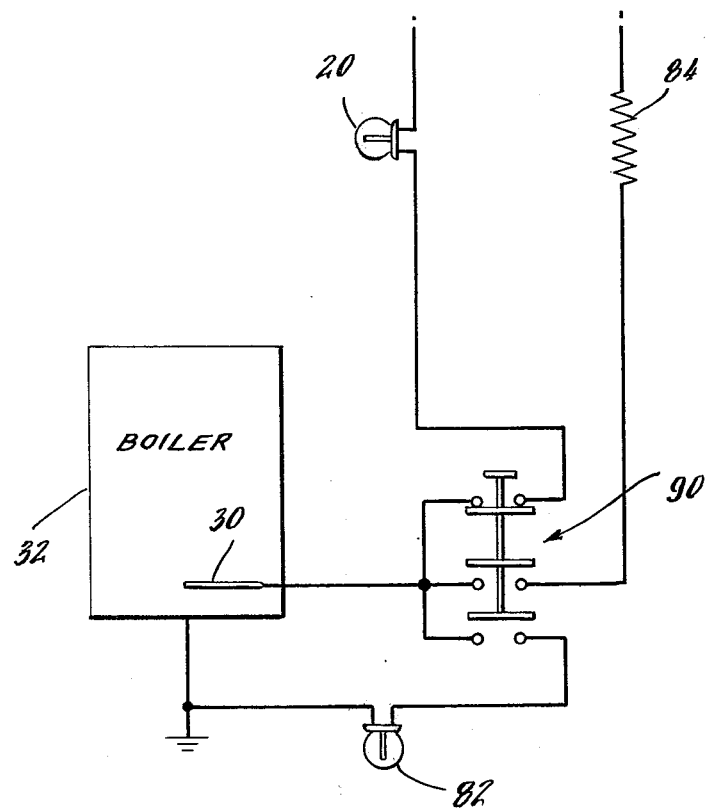
FIG. 2 is a schematic diagram of a modification of the circuit of FIG. 1.

FIG. 2 illustrates a modification of the circuit of FIG. 1. The major portion of the control circuit is identical to that of FIG. 1 and, accordingly, is omitted. Elements which are the same are given similar reference numerals.

The primary difference between the circuits of FIG. 1 and FIG. 2 is that in the latter the test switch is a 3 pole switch 90, one pole being normally closed and 2 poles normally open. The normally open poles are connected identically to those of FIG. 1 and function in the same manner. The normally closed pole is connected in series with the heater lamp 20. This overcomes a possible problem with the FIG. 1 circuit. In that circuit, when switch 80 is closed, the heater lamp 20 is connected to ground through lamp 82. Thus, if the switch is held closed for a long enough period of time, the burner may fire even though the boiler water level is below electrode 30. The circuit of FIG. 2 eliminates this possibility by opening the circuit of heater lamp 20. It also introduces an additional test function. If held down for the time delay period, it will shut down the burner and test the functioning of the safety and alarm circuits.

Figure 3:
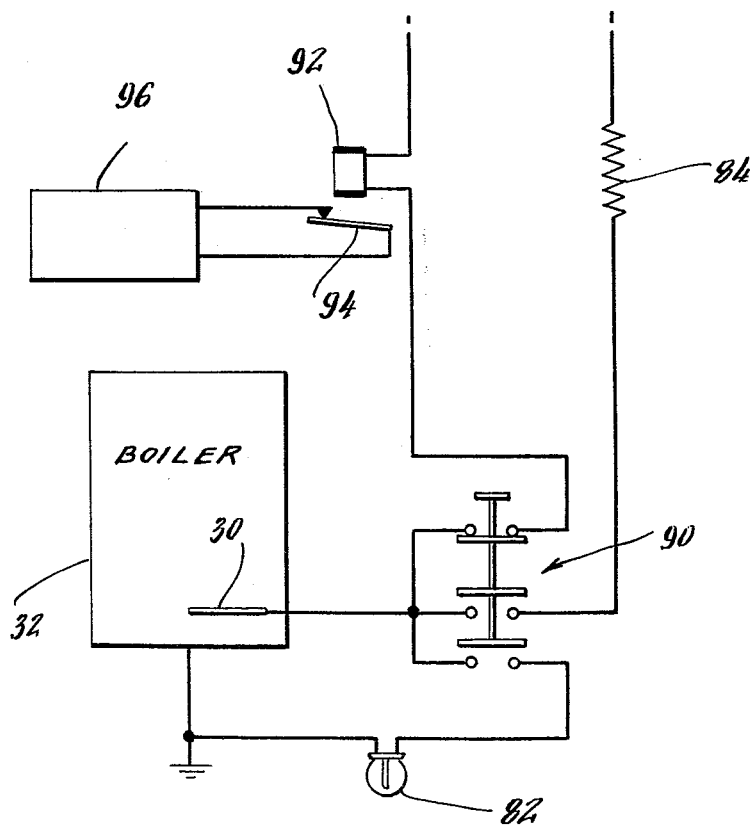
FIG. 3 is a schematic diagram of the invention as incorporated in a low water cutoff circuit.

FIG. 3 illustrates the application of the test switch 90 to a low water cutoff circuit. In this circuit, electrode 30 serves only for low water cutoff and is in series with a burner control relay coil 92 whose contacts 94 are connected to burner control circuit 96. When test switch 90 is activated, relay coil 92 is deenergized, lamp 82 indicates the presence or absence of a ground at electrode 30, and resistor 84 limits the current flow in the presence of such a ground.

It is believed that the many advantages of this invention will now be apparent to those skilled in the art. It will also be apparent that a number of variations and modifications may be made therein without departing from its spirit and scope. Accordingly, the foregoing is to be taken as illustrative only, rather than limiting. This invention is limited only by the following claims.

We claim:

1. In a control circuit including a branch having a water path through which electrical current normally flows, the improvement for detecting a short circuit around said water path which comprises: a test switch having normally open first and normally closed second contacts, said normally closed second contacts being in series with said branch; a voltage indicator; and means connecting said normally open first contacts and voltage indicator in series across said water path to indicate a potential drop thereacross.

2. The improvement of claim 1 wherein said branch includes a heating element in series with said water path; said test switch includes normally open third contacts; and said connecting means includes a resistor connected in series with said normally open third contacts across said heating element.

3. The improvement of claim 1 wherein said voltage indicator is a lamp.

4. The improvement of claim 2 wherein said voltage indicator is a lamp.

5. A safety control system for actuating and deactuating a burner circuit for a boiler comprising, first and second electrical circuits and power supply means for said circuits; said first electrical circuit including a heat source, an initially closed switch, thermostat and aquastat means and switch in said first circuit responsive thereto, an electrode disposed in the boiler for completing said first circuit through a water path to the grounded wall of the boiler when the water level in the boiler is not below the electrode, and when the water level in the boiler falls below the electrode the heat source is deenergized and the consequent movement of the heat sensitive means causes reopening of an initially open switch of the second circuit and deactuation of said controlled circuit; said second electrical circuit including said initially open switch, means operative when said initially open switch of said second circuit is closed to actuate said control circuit, and heat sensitive means operative when both the switches of said first circuit are closed to close the initially open switch of said second circuit and, after a time interval, open the initially closed switch of the first circuit; and a test circuit comprising a test switch having normally open first and normally closed second contacts, said normally closed second contacts being in series with said water path, a voltage indicator, and means connecting said normally open first contacts and voltage indicator in series across said water path to indicate a potential drop thereacross.

* * * * *